United States Patent [19]
Ogawa

[11] Patent Number: 6,144,251
[45] Date of Patent: Nov. 7, 2000

[54] SEMICONDUCTOR INTEGRATED CIRCUIT DEVICE HAVING COMPONENT CIRCUITS FREE FROM THROUGH-CURRENT IN TRANSITION PERIOD BETWEEN ACTIVE MODE AND SLEEP MODE

[75] Inventor: Tadahiko Ogawa, Tokyo, Japan

[73] Assignee: NEC Corporation, Tokyo, Japan

[21] Appl. No.: 09/329,253

[22] Filed: Jun. 10, 1999

[30]    Foreign Application Priority Data

Jun. 12, 1998   [JP]   Japan .................................. 10-165297

[51] Int. Cl.[7] .................................. G05F 1/10; G05F 3/02
[52] U.S. Cl. ........................................... 327/544; 327/546
[58] Field of Search .................................. 327/530, 535, 327/537, 538, 540, 541, 543–546, 185; 326/56–58; 365/185.18

[56]            References Cited

U.S. PATENT DOCUMENTS

| | | | |
|---|---|---|---|
| 5,781,062 | 7/1998 | Mashiko et al. ........................ | 327/544 |
| 5,874,851 | 2/1999 | Shiota ....................................... | 327/537 |
| 5,898,321 | 4/1999 | Ilkbahar et al. ............................ | 326/87 |
| 6,031,778 | 2/2000 | Makino et al. ........................... | 365/226 |
| 6,034,563 | 3/2000 | Mashiko ................................... | 327/544 |

FOREIGN PATENT DOCUMENTS

| | | |
|---|---|---|
| 6-29834 | 2/1994 | Japan . |
| 7-135461 | 5/1995 | Japan . |

*Primary Examiner*—My-Trang Nu Ton
*Attorney, Agent, or Firm*—McGuire Woods, LLP

[57]                ABSTRACT

A semiconductor integrated circuit device has a high-speed bus driver and a bus receiver both connected to a bus line, and the high-speed bus driver enters an active mode powered from a positive power voltage line and a virtual ground line and a sleep mode isolating the virtual ground line from a ground line for reducing power consumption, wherein a switching circuit is connected between the high-speed bus driver and the bus line so as to isolate the bus line from the high-speed bus driver in transition periods and the sleep mode, thereby cutting a conductive path for through-current due to leakage current inherent in the high-speed component field effect transistors of the bus driver.

28 Claims, 10 Drawing Sheets

| CONTROL SIGNAL KPB2 | CLAMP CIRCUIT 64 |
|---|---|
| 1 (HIGH LEVEL) | HIGH IMPEDANCE |
| 0 (LOW LEVEL) | OUTPUT = 1 (HIGH LEVEL) |

Fig. 9

SEMICONDUCTOR INTEGRATED CIRCUIT DEVICE HAVING COMPONENT CIRCUITS FREE FROM THROUGH-CURRENT IN TRANSITION PERIOD BETWEEN ACTIVE MODE AND SLEEP MODE

FIELD OF THE INVENTION

This invention relates to a semiconductor integrated circuit device and, more particularly, a semiconductor integrated circuit device having a component circuit with a built-in leakage stopper in a sleep mode.

DESCRIPTION OF THE RELATED ART

If a semiconductor integrated circuit device is designed to operate under a low voltage such as 1 volt, the power consumption is to be reduced, and undesirable heat generation is restricted. However, the low-voltage operation requires a low-threshold component transistors. When the power voltage is reduced to 1 volt, the component field effect transistors are designed to have the threshold of the order of 0.2 volt. The lower the threshold, the thinner the gate insulating layer. As a result, leakage current through the thin gate insulating layers is increased, and the reduction of power consumption is not so much as expected. On the contrary, while the semiconductor integrated circuit device is standing idle, the power consumption is increased due to the leakage current.

A solution is proposed in Japanese Patent Publication of Unexamined Application No. 6-029834. The Japanese Patent Publication of Unexamined Application proposes to connect high-threshold field effect transistors between a low-voltage logic circuit and power supply lines. As a result, virtual power supply lines are directly connected to the low-voltage logic circuit. The prior art circuit configuration is hereinbelow referred to as "logic circuit with leakage stopper". If the virtual power supply line technology is applied to actual semiconductor integrated logic circuits, various problems are encountered in the semiconductor integrated logic circuits.

FIG. 1 illustrates a prior art data transfer system, and the virtual power supply line technology is applied to the prior art data transfer system. The prior art data transfer system includes plural bus driver units BD1/BD2, plural receiver units BR1 and a bus line BUS, and the bus driver units BD1/BD2 and the receiver units BR1 are connected to the bus line BUS1. The bus driver units BD1/BD2 are respectively enabled with enable signals EN1/EN2, and becomes responsive to data signals DT1/DT2 so as to supply inverted data signals IDT1/IDT2 to the bus line BUS1. Thus, the bus driver units BD1/BD2 are a kind of tri-state inverter, and a piece of data information is transferred through the bus line BUS1 from one of the bus driver units to one of the receiver units.

The bus driver unit BD1 includes an inverter LV11, i.e., a series combination of a p-channel enhancement type field effect transistor and an n-channel enhancement type field effect transistor, a transfer gate TM1, i.e., a parallel combination of a p-channel enhancement type field effect transistor and an n-channel enhancement type field effect transistor and an inverter LV12. The inverter LV11 or the series combination of the p-channel enhancement type field effect transistor and the n-channel enhancement type field effect transistor is connected between a power supply line VDD and a virtual ground line VGND, and the data signal DT1 is supplied to the input node of the inverter LV11, i.e., the gate electrode of the p-channel enhancement type field effect transistor and the gate electrode of the n-channel enhancement type field effect transistor. The inverter LV12 is similar in circuit configuration to the inverter LV11. The inverter LV12 is also connected between the power supply line VDD and the virtual ground line VGND, and produces an inverted enable signal IEN1 from the enable signal EN1. The transfer gate TM1 is connected between the output node of the inverter LV11 and the bus line BUS1, and allows electric current to bi-directionally flow therethrough. The enable signal EN1 and the inverted enable signal IEN1 are supplied to the gate electrode of the transfer gate TM1, i.e., the gate electrode of the n-channel enhancement type field effect transistor and the gate electrode of the p-channel enhancement type field effect transistor.

The other bus driver unit BD2 also includes an inverter LV21, a transfer gate TM2 and an inverter LV22, which are similar to the inverter LV21, the transfer gate TM2 and the inverter IV22, respectively. For this reason, those components LV21, TM2 and LV22 are not detailed for the sake of simplicity.

When the enable signal EN1/EN2 is changed to the active high level, the inverter LV12/LV22 changes the inverted enable signal IEN1/IEN2 to the low level. The enable signal EN1/EN2 of the high level is supplied to the gate electrode of the n-channel enhancement type field effect transistor of the associated transfer gate TM1/TM2, and the inverted enable signal IEN1/IEN2 is supplied to the gate electrode of the p-channel enhancement type field effect transistor of the associated transfer gate TM1/TM2. Then, both the field effect transistors of the transfer gate TM1/TM2 turn on, and the inverter LV11/LV21 is connected through the transfer gate TM1/TM2 to the bus line BUS1. The inverter LV11/LV21 selectively connects the power supply line VDD and the virtual ground line VGND to the output node thereof depending upon the data signal DT1/DT2, and supplies the inverted data signal IDT1/IDT2 to the bus line BUS1.

On the other hand, when the enable signal EN1/EN2 is changed to the low level, the inverter LV12/LV22 changes the inverted enable signal IEN1/IEN2 to the high level, and the enable signal EN1/EN2 of the low level and the inverted enable signal IEN1/IEN2 of the high level make the n-channel enhancement type field effect transistor and the p-channel enhancement type field effect transistor turn off, and the bus driver unit BD1/BD2 enters the high-impedance state.

Thus, the bus line BUS1 is connected to the plural bus driver units BD1/BD2 and plural receiver units such as BR1, and transfers a piece of data information from any one of the bus driver units BD1/BD2 to any one of the receiver units. More than one bus driver unit does not concurrently supply the inverted data signal to the bus line BUS1. Thus, the bus contention is not allowed in the prior art data transfer system. Moreover, any one of the bus driver units makes the bus line BUS1 valid at any timing, and the bus floating state is also not allowed.

As described hereinbelow, the inverters LV11/LV12/LV21/LV22 and the transfer gates TM1/TM2 are implemented by the field effect transistors. The p-channel enhancement type field effect transistors and the n-channel enhancement type field effect transistors have low thresholds, and are kinds of the low-threshold field effect transistor. The low-threshold field effect transistors are switched at high speed.

The virtual ground line VGND is connected through an n-channel enhancement type field effect transistor HNS1 to the ground. The n-channel enhancement type field effect transistor HNS1 has the threshold higher than that of the low-threshold n-channel enhancement type field effect transistors, and an inverted sleep mode signal SLB is supplied to the gate electrode of the high-threshold n-channel enhancement type field effect transistor HNS1. When a sleep mode signal SL is in the low level, the sleep mode signal SL is indicative of an active mode, and the inverted sleep mode signal SLB makes the high-threshold n-channel enhancement type field effect transistor HNS1 turn on. The ground level is supplied through the high-threshold n-channel enhancement type field effect transistor HNS1 to the inverters LV11/LV12/LV21/LV22, and the virtual ground line VGND and the power supply line VDD activate the bus driver units BD1/BD2 and the receiver units BR1. Thus, the ground level is supplied to the inverters LV11/LV12/LV21/LV22 through the high-threshold n-channel enhancement type field effect transistor HNS1, and the potential level on the virtual ground line VGND is hereinbelow referred to as "virtual ground level".

On the other hand, if the sleep mode signal SL is changed to the high level, the prior art data transfer system enters into a sleep mode or a power-saving mode, and the inverted sleep mode signal SLB of the low level causes the high-threshold n-channel enhancement type field effect transistor HNS1 turn off. As a result, the high-threshold n-channel enhancement type field effect transistor HNS1 blocks the bus driver units BD1/BD2 and the receiver units BR1 from the virtual ground level, and the bus driver units BD1/BD2 and the receiver units BR1 do not transfer a piece of data information to the bus line BUS1. The high-threshold n-channel enhancement type field effect transistor does not allow sub-threshold leakage current to flow, and reduces the power consumption in the sleep mode. Thus, the prior art data transfer system is a kind of the logic gate with leakage stopper.

FIG. 2 illustrates a data transfer through the prior art data transfer system. The prior art data transfer system is in the active mode between until time t3, stands idle in the sleep mode between time t3 and time t6, and is recovered from the sleep mode to the active mode at time t6.

The high-threshold n-channel enhancement type field effect transistor HNS1 has already turned on, and the virtual ground line VGND is electrically connected through the high-threshold n-channel enhancement type field effect transistor HNS1 to the ground. The enable signals EN1 and EN2 are in the inactive low level and in the active high level before time t1, respectively, and the bus driver units BD1/BD2 are disabled and enabled with the enable signals EN1/EN2. The bus driver unit BD1 is in the high impedance state, and the other bus driver unit BD2 is responsive to the data signal DT2. For this reason, the inverted data signal DT2 of the high level is transferred from the bus driver unit BD2 to the bus line BUS1. In other words, the bus line BUS1 is in the high level.

The enable signals EN1/EN2 are changed to the high level and the low level, respectively, at time t1, and the data signals DT1/DT2 are still in the high level and in the low level, respectively. The bus driver unit BD1 is enabled with the enable signal EN1, and the other bus driver unit BD2 is disabled. The bus driver unit BD2 enters the high-impedance state, and the other bus driver unit BD1 becomes responsive to the data signal DT1. As a result, the bus driver unit BD1 supplies the inverted data signal IDT1 of the low level to the bus line BUS1, and the bus line BUS1 is changed to the low level.

The enable signals EN1/EN2 are maintained in the high level and in the low level, respectively, through time t2. However, the data signals DT1/DT2 are changed to the low level and to the high level at time t2. The bus driver unit BD1 still responsive to the data signal DT1, and the other bus driver unit BD2 remains disabled. As a result, the bus driver unit BD1 changes the inverted data signal IDT1 to the high level, and the bus line BUS1 is changed to the high level.

Thus, while the prior art data transfer system is operating in the active mode, the bus driver units BD1/BD2 are selectively enabled with the associated enable signals EN1/EN2, and one of the bus driver units BD1/BD2 outputs the inverted data signal IDT1/IDT2 to the bus line BUS1. The bus driver units BD1/BD2 are implemented by the low-threshold field effect transistors, and a piece of data information is transferred from the data signals DT1/DT2 to the potential level on the bus line BUS1 at high speed.

The sleep mode signal SL is changed to the active high level at time t3, and, accordingly, the inverted sleep mode signal SLB is changed to the low level. The high-threshold n-channel enhancement type field effect transistor HNS1 turns on, and the virtual ground line VGND is electrically isolated from the ground level. The inverters LV12/LV22 can not invert the enable signals EN1/EN2, and the inverters LV11/LV21 can not invert the data signals DT1/DT2. However, the sleep mode signal SL and the inverted sleep mode signal SLB are valid to the prior art data transfer system, only. The enable signals EN1/EN2 and the data signals DT1/DT2 are generated by another logic circuit (not shown), and the logic circuit does not always enter the sleep mode concurrently with the prior art data transfer system. This means that the data signals DT1/DT2 may be inconsistent between the entry into the sleep mode and the exit from the sleep mode.

Japanese Patent Publication of Unexamined Application No. 6-029834 proposes to make the inputs to a logic circuit with a leakage stopper consistent between the entry into the sleep mode and the exit from the sleep mode. If the technology proposed in Japanese Patent Publication of Unexamined Application No. 6-029834 is applied to the prior art data transfer system, the prior art data transfer system behaves as follows. Before the entry into the sleep mode, the data signal DT1/DT2 and the enable signals EN1/EN2 are fixed to the logic levels in the current active mode. The data signals DT1/DT2 are fixed to the low level and the high level, respectively, and the enable signals EN1/EN2 are fixed to the high level and the low level, respectively. Then, the prior art data transfer system enters the sleep mode, and the virtual ground line VGND is electrically isolated from the ground level. When the prior art data transfer system exits from the sleep mode, the data signals DT1/DT2 and the enable signals EN1/EN2 are released from the logic level in the previous active mode. The status around the prior art data transfer system is not changed, and the prior art data transfer system can continue the data transfer without a trouble due to the data inconsistency.

However, there is a possibility that the bus driver units BD1/BD2 change the data/enable signals in the sleep mode. As described hereinbefore, the data signal/enable signal DT1/EN2 are fixed to the low level before the entry into the sleep mode, and the data signal/enable signal DT2/EN2 are fixed to the high level also before the entry into the sleep mode. Although the high-threshold n-channel enhancement type field effect transistor HNS1 electrically isolates the virtual ground line VGND and the bus driver units BD1/BD2 from the ground level, the bus driver units BD1/BD2 are still connected to the power supply line VDD. Leakage current flows from the power supply line VDD through the low-threshold p-channel enhancement type field effect transistors to the signal line for the data signal DT1 and the signal line for the enable signal EN2. The power supply line VDD charges the signal line for the data signal DT1 through the low-threshold p-channel enhancement type field effect transistor over a time period tD1C, and the data signal DT1 reaches the high level at time t5. Similarly, the power supply line VDD charges the signal line for the enable signal EN2 through the low-threshold p-channel enhancement type field effect transistor over a time period tE2C, and the enable signal EN2 reaches the high level at time t5.

The inverted sleep mode signal SLB is changed to the high level at time t6, and the prior art data transfer system is recovered from the sleep mode to the active mode. The high-threshold n-channel enhancement type field effect transistor HNS1 turns on, and electrically connects the virtual ground line VGND to the ground. The virtual ground line VGND is recovered to the potential level approximately equal to the ground level. The data signal DT1 and the enable signal EN2 are recovered to the previous logic level, i.e., the low level. The data signal DT1 falls over a time period tD1B, and reaches the low level at time t7. On the other hand, the enable signal EN2 consumes a time period tE2B, and reaches the low level at time t8. Then, the data signals DT1/DT2 and the enable signals EN1/EN2 are consistent with those before the sleep mode, and the prior art data transfer system restarts the data transfer after time t8.

Thus, the prior art data transfer system with the leakage stopper is to reduce the current consumption without a trouble due to the undesirable change of the input signals in the sleep mode. However, the reduction of power consumption is not so much as expected, again. Through-current flows from the power supply line VDD and the ground in the transient period from the active mode to the sleep mode and the transient period from the sleep mode to the active mode.

In detail, the data signals DT1/DT2 and the enable signals EN1/EN2 have been fixed to the current potential levels before entry into the sleep mode, and the prior art data transfer system enters the sleep mode at time t3. Then, current flows through the bus line BUS1 as indicated by arrow AR1, and the current is wasteful.

As described hereinbefore, the prior art data transfer system is accompanied with a logic circuit, and the logic circuit also has a leakage stopper. Plural data transfer systems are usually incorporated in the semiconductor integrated circuit device, and logic circuits are sequentially connected to each data transfer system. In this situation, it is impossible for the logic circuits to concurrently enter the sleep mode. For example, the data signals DT1/DT2 and the enable signals EN1/EN2 are supplied from a logic circuit with a leakage stopper, to which another logic circuit supplies data signals. The logic circuits and the prior art data transfer system usually enter the sleep mode at different timings, and the time periods tD1C/tE2C are unavoidable.

In the transient time from the active mode to the sleep mode, the signal line for the enable signal EN2 is charged earlier than the signal line for the data signal DT1. As a result, both of the transfer gates TM1/TM2 are enabled after time t4, and the bus contention takes place between the bus driver units BD1 and BD2. The bus contention is continued over a time period tBW1 between time t4 and time t5. In the time period tBW1, the signal line for the data signal DT1 is lower in potential level than the signal line for the data signal DT2, and the signal lines for the data signals DT1/DT2 are causative of the current path indicated by arrow AR1. The signal line for the data signal DT1 allows the p-channel enhancement type field effect transistor of the inverter LV11 to turn on, and the current flows from the power supply line VDD to the transfer gate TM1. The enable signal EN1 makes the transfer gate TM1 turn on, and the current passes through the transfer gate TM1. The current flows through the bus line BUS1, and reaches the transfer gate TM2 already turned on due to the enable signal EN2. The current passes through the transfer gate TM2, and reaches the inverter LV21. The signal line for the data signal DT2 have already caused the n-channel enhancement type field effect transistor of the inverter LV21 to turn on, and the current flows through the inverter LV21 into the virtual ground line VGND. The high-threshold n-channel enhancement type field effect transistor HNS1 does not completely turn off in the transition period, and the current is discharged to the ground. This is because of the fact that another logic circuit with a leakage stopper generates the sleep mode signal SL and the inverted sleep mode signal SLB. In other words, another circuit enters the sleep mode at a different timing.

Before the prior art data transfer system exits from the sleep mode to the active mode, both data signals DT1/DT2 and both enable signals EN1/EN2 are in the high level. While the logic circuits are recovering the data signal DT1 and the enable signal EN2 from the high level to the low level, current flows from the power supply line VDD to the ground as similar to the transient period from the active mode to the sleep mode. The recovery time period tD1B is shorter than the recovery time period tE2B. Both enable signals EN1/EN2 are maintained in the high level in a time period tBW2 from time t7 to time t8, and the bus contention takes place between the bus driver units BD1 and BD2. The data signal DT1 is recovered to the low level at time t7, and makes the p-channel enhancement type field effect transistor of the inverter LV11 turn on. On the other hand, the data signal DT2 of the high level makes the n-channel enhancement type field effect transistor of the inverter LV21 turn on. The enable signals EN1/EN2 of the high level allow the transfer gates TM1/TM2 to turn on. Then, the current flows from the power supply line VDD through the bus line BUS1, the virtual ground line VGND and the high-threshold n-channel enhancement type field effect transistor HNS1 to the ground as similar to the transient period from the active mode to the sleep mode. Although the change from the sleep mode to the active mode is not concurrent between the logic circuits as described hereinbefore, the high-threshold n-channel enhancement type field effect transistor HSN1 has been completely turned on before the through-current, because the high-threshold n-channel enhancement type field effect transistor is changed to the on-state so as to discharge the virtual ground line VGND to the ground.

SUMMARY OF THE INVENTION

It is therefore an important object of the present invention to provide a semiconductor integrated circuit device, which is free from through-current in a transition period between an active mode and a sleep mode.

To accomplish the object, the present invention proposes to disconnect a logic circuit from a signal line such as, for example, a bus line in a sleep mode.

In accordance with one aspect of the present invention, there is provided a semiconductor integrated circuit device comprising a first component circuit selectively entering an active mode and a sleep mode and including an input port having plural input nodes supplied with input signals, an output port having output nodes assigned to output signals and first transistors connected between a first power supply line and a virtual power supply line different in potential level from the first power supply line, much liable to flow a first leakage current therethrough and responsive to the input signal in the active mode for producing the output signal at the output port, a second transistor connected between the virtual power supply line and a second power supply line different in potential level from the first power supply line, less liable to flow a second leakage current therethrough and responsive to a mode signal so as to connect the virtual power supply line to the second power supply line in the active mode and disconnect the virtual power supply line from the second power supply line, a signal line connectable to the plural output nodes, and a switching circuit connected between the output nodes and the signal line and responsive to a control signal so as to connect the output nodes to the signal line in the active mode and disconnect the output nodes from the signal line in at least the sleep mode.

BRIEF DESCRIPTION OF THE DRAWINGS

The features and advantages of the semiconductor integrated circuit device will be more clearly understood from the following description taken in conjunction with the accompanying drawings in which:

FIG. 9 is a view showing a truth table for an anti-floating circuit incorporated in the semiconductor integrated circuit device shown in FIG. 8.

DESCRIPTION OF THE PREFERRED EMBODIMENTS

First Embodiment

Figure 3:
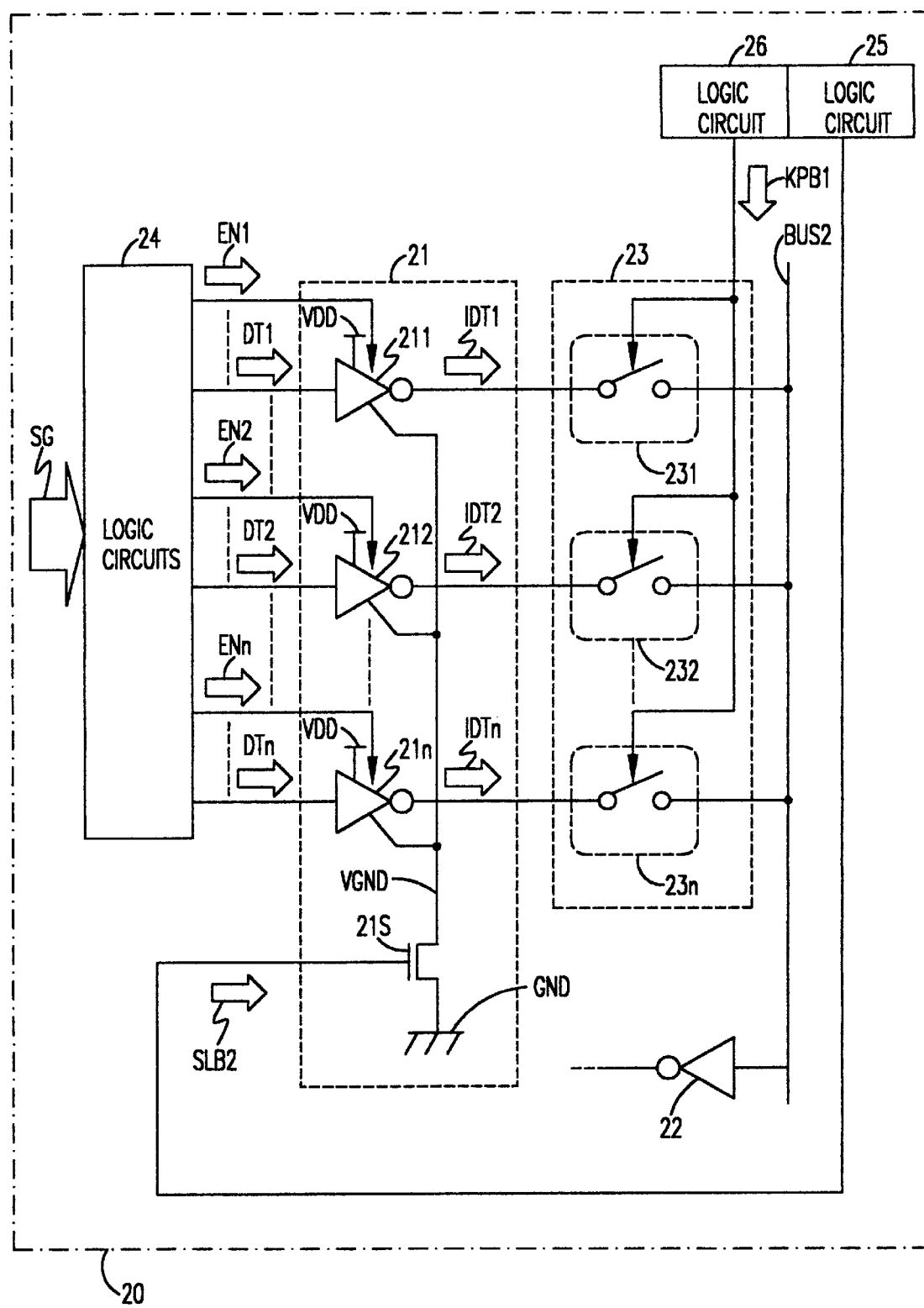
FIG. 3 is a circuit diagram showing the circuit configuration of an essential part of a semiconductor integrated circuit device according to the present invention.

Referring to FIG. 3 of the drawings, an integrated circuit is fabricated on a semiconductor chip 20. The integrated circuit comprises a bus line BUS2, a bus driver 21 connected to the bus line BUS2, a bus receiver 22 also connected to the bus line BUS2, a switching circuit 23 connected between the bus driver 21 and the bus line BUS2 and logic circuits 24/25/26. The logic circuit 25 changes a sleep mode signal SLB2 between an active low level and an inactive high level, and the sleep mode signal SLB2 selectively establishes an active mode and a sleep mode in the bus driver 21. The bus driver 21 in the active mode can drive the bus line BUS2. On the other hand, the bus driver 21 is blocked from a power source in the sleep mode. The logic circuits 24 supply enable signals EN1/EN2/ . . . /ENn and data signals DT1/DT21 . . . /DTn to the bus driver 21, and the bus driver 21 drives the bus line BUS2 with an inverted data signal IDT1/IDT2/ . . . /IDTn specified by the enable signal in the active mode. The logic circuit 26 supplies a control signal KPB1 to the switching circuit 23 in transition periods between the active mode and the sleep mode, and the switching circuit 23 does not allow the bus line BUS2 to offer a current path to through-current. The bus receiver 22 transfers the inverted data signal from the bus line BUS2 to another logic circuit (not shown).

The logic circuits 24 are implemented by the complementary field effect transistors, and the sleep mode and the active mode are selectively established in the logic circuits 24. The logic circuits 24 are connected to a power supply line in the active mode, and are disconnected from the power supply line in the sleep mode. For this reason, the logic circuits 24 are of a kind of the logic circuit with a leakage stopper. The bus receiver may be of a kind of the logic circuit with a leakage stopper.

The prior art technology disclosed in Japanese Patent Publication of Unexamined Application No. 7-135461 is applied to control signals such as the enable signals EN1–ENn and data signals such as the data signals DT1–DTn. The logic circuits 24 determine the potential levels of the enable signals EN1/ENn and the potential levels of the data signals DT1–DTn before entry into the sleep mode, and release them from the previous potential levels after the exit from the sleep mode. Signals SG are supplied to the logic circuits 24, and are also fixed to current logic levels before the logic gates 24 enter the sleep mode. Although the enable signals EN1–ENn and the data signals DT1–DTn are supplied to the bus driver 21, the signals EN1–ENn/DT1–DTn are not concurrently fixed to previous logic levels, and are not always released from the previous logic levels at the same time. This is because of the fact that the logic gates to be required are different between the signals and that the time constant against the signal propagation is different between the signal lines for those signals. The logic circuits 24 may have the same circuit configuration as the power-down control circuit and the circuit group disclosed in Japanese Patent Publication of Unexamined Application No. 7-135461.

The bus driver 21 is of the logic circuit with a leakage stopper, and includes tri-state inverters 211/212/. . ./21n and a high-threshold n-channel enhancement type switching transistor 21s. The tri-state inverters 211–21n are implemented by complementary transistors, i.e., series combinations of n-channel enhancement type field effect transistors and p-channel enhancement type field effect transistors. The n-channel enhancement type field effect transistors and the p-channel enhancement type field effect transistors are of the type having a low threshold type, and achieve a high-speed switching action.

The tri-state inverters 211–21n are similar in circuit configuration to the tri-state inverter LV11/LV21 of the prior art bus driver BD1/BD2. The tri-state inverters 211–21n are powered through a positive power voltage line VDD and a virtual ground line VGND. The enable signals EN1–ENn are respectively supplied to the tri-state inverters 211–21n, and make the associated tri-state inverters 211–21n selectively responsive to the data signals DT1–DTn. For example, when the enable signal EN1 is changed to the active high level, the tri-state inverter 211 is responsive to the data signal DT1 so as to drive the bus line BUS2 with the inverted data signal IDT1. In this situation, the other enable signals EN2–ENn remain inactive, and the associated tristate inverters 212–21n do not respond to the data signals DT2–DTn. In other words, the tri-state inverters 212–21n are in the high-impedance state with respect to the data output nodes thereof. More than one tri-state inverter is never concurrently enabled with the associated enable signals EN1–ENn, and all of the tri-state inverters 211–21n do not concurrently enter the high-impedance state. In other words, one of the tri-state inverters 211–21n is electrically connected to the bus line BUS2 in the active mode.

The high-threshold n-channel enhancement type switching transistor 21s has a threshold higher than that of the n-channel enhancement type field effect transistor. The high-threshold n-channel enhancement type switching transistor 21s is connected between the virtual ground line VGND and a ground line GND, and the sleep mode signal SLB2 is supplied to the gate electrode of the high-threshold n-channel enhancement type switching transistor 21s. While the high-threshold n-channel enhancement type switching transistor 21s is staying in the on-state, the virtual ground line VGND is electrically connected to the ground line GND, and the tri-state inverters 211–21n are powered through the positive power supply line VDD and the virtual ground line VGND, and the tri-state inverters 211–21n drive the bus line BUS2 with the inverted data signals IDT1–IDTn, selectively. On the other hand, if the sleep mode signal SLB2 is changed to the low level, the high-threshold n-channel enhancement type switching transistor 21s turns off, and the virtual ground line VGND is electrically isolated from the ground line GND. The bus driver 21 enters the sleep mode, and any tri-state inverter 211–21n does not respond to the data signal DT1–DTn. The sub-threshold leakage current is so little in the high-threshold n-channel enhancement type switching transistor 21s that the power consumption is drastically reduced in the sleep mode.

The switching circuit 23 is implemented by plural switching elements 231/232/ . . . /23n. The switching elements 231–23n are connected between the tri-state inverters 211–21n and the bus line BUS2, and are concurrently responsive to the control signal KPB1 so as to connect the tri-state inverters 211–21n to or disconnect them from the bus line BUS2. In this instance, the switching elements 231–23n are respectively implemented by n-channel enhancement type switching transistors, and the n-channel enhancement type switching transistors 231–23n have either high or low threshold.

Figure 4:
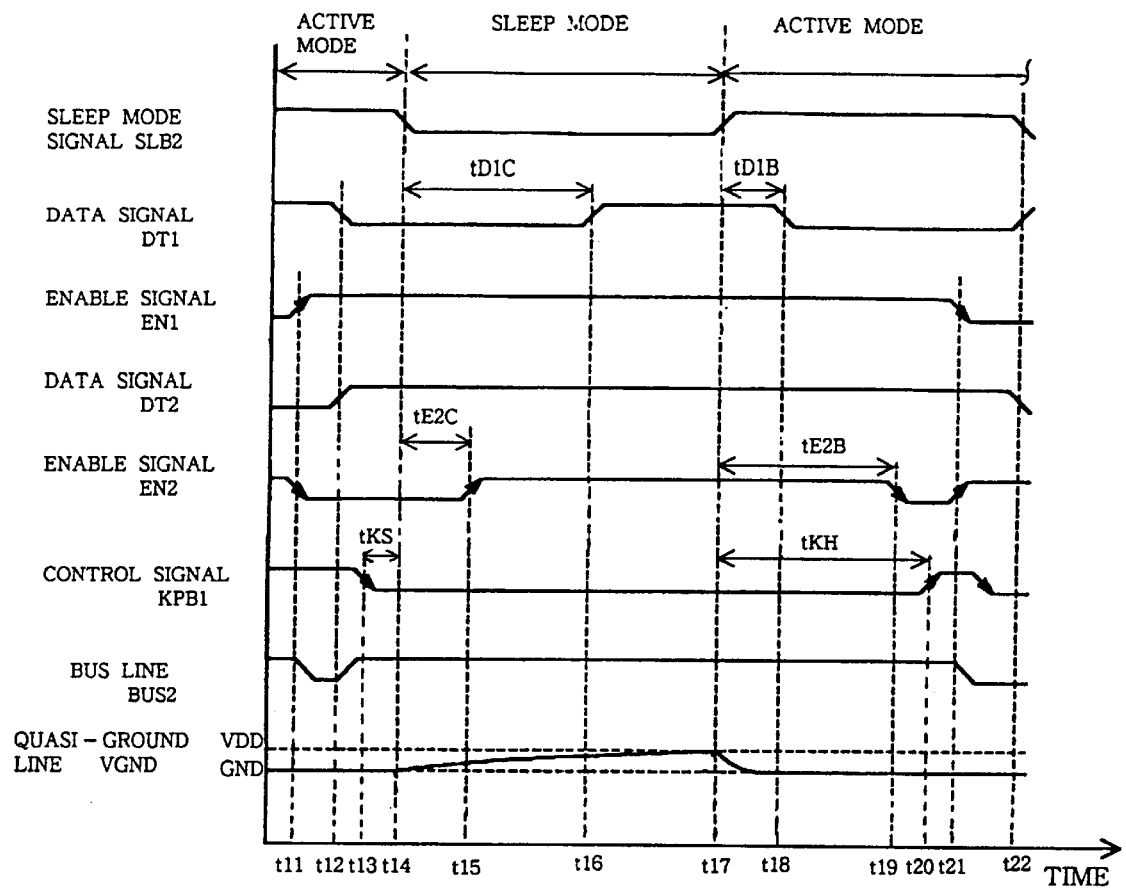
FIG. 4 is a timing chart showing transitions between an active mode and a sleep mode in the semiconductor integrated circuit device.

The bus driver 21, the switching circuit 23 and the logic circuits 24–26 behave as shown in FIG. 4. The sleep mode signal SLB2 is changed from the high level to the low level at time t14, and is recovered to the high level at time t17. The sleep mode is established in the bus driver 21 between time t14 and time t17.

The enable signals EN1–ENn are valid in the active mode, and make the tri-state inverters 211–21n selectively responsive to the associated data signals DT1–DTn. The logic circuit 26 keeps the control signal KPB1 in the high level before time t13, and all the switching elements 231–23n are turned on before time t13. In the active mode before time t14 and after time t17, the enable signals EN3–ENn are assumed to be maintained in the inactive low level.

The enable signal EN2 is in the high level before time t11, and the tri-state inverter 212 drives the bus line BUS2 with the inverted data signal IDT2. The data signal DT2 is in the low level before time t11, and, accordingly, the bus line BUS2 is maintained in the high level.

The enable signal EN2 falls at time t11, and the enable signal EN1 rises at time t11. The tri-state inverter 212 is enabled with the associated enable signal EN1, and becomes responsive to the associated data signal DT1. The data signal DT1 is in the high level at time t11, and the tri-state inverter 211 drives the bus line BUS2 with the inverted data signal IDT1. As a result, the bus line BUS2 falls to the low level.

The enable signal EN1 is still in the high level at time t12, and the data signal DT1 is changed to the low level at time t12. The tri-state inverter 211 changes the inverted data signal IDT1 to the high level, and the bus line BUS2 starts to rise toward the high level at time t12. Although the data signal DT2 is changed to the high level at time t12, the tri-state inverter 212 does not respond to the data signal DT2, because the enable signal EN2 is in the low level.

Thus, the high-threshold n-channel enhancement type switching transistor 21s electrically connects the ground line GND to the virtual ground line VGND in the active mode, and the tri-state inverters 211–21n are selectively enabled with the enable signals EN1–ENn so as to drive the bus line BUS2. The component field effect transistors of the tri-state inverters 211–21n have the low threshold, and the selected tri-state inverter inverts the data signal at high speed.

Prior to the entry into the sleep mode at time t14, the logic circuit 26 changes the control signal KPB1 from the high level to the low level, and the switching elements 231–23n concurrently turn off. The switching circuit 23 electrically isolates the bus line BUS2 from the bus driver 21 at time t13, and the sleep mode signal SLB2 is changed to the low level after a set-up time tKS.

When the sleep mode signal SLB2 is changed to the low level, the high-threshold n-channel enhancement type switching transistor 21s turns off, and the virtual ground line VGND is electrically isolated from the ground line GND. The low power voltage, i.e., the virtual ground level is not supplied to the tri-state inverters 211–21n after time t14. The power consumption in the sleep mode is drastically reduced, because the sub-threshold leakage current is negligible.

The high-threshold n-channel enhancement type switching transistor 21s keeps the virtual ground line VGND in the floating state. Leakage current unavoidably flows from the positive power voltage line VD through the low-threshold n-channel enhancement type field effect transistors to the signal lines assigned to the data signal DT1 and the enable signal EN2. The signal line for the enable signal EN2 reaches the high level at time t15, and the signal line for the data signal DT1 reaches the high level at time t16. Thus, the signal line for the enable signal EN2 and the signal line for the data signal DT1 are unintentionally changed to the low level and to the high level in the sleep mode. The lapse of time from time t14 to time t15 is labeled with "tE2C", and the lapse of time from time t14 to time t16 is labeled with "tD1C".

The enable signals EN1/EN2 in the high level puts the bus line BUS2 in the bus contention, and the bus driver 21 makes ready to flow current through the bus line BUS2 due to the data signal DT1 in the low level and the data signal DT2 in the high level. The tri-state inverter 211 offers a current path from the positive power supply line VDD through the low-threshold n-channel enhancement type field effect transistor and the transfer gate thereof to the output node thereof, the tri-state inverter 212 offers a current path from the output node thereof through the transfer gate and the p-channel enhancement type field effect transistor thereof to the virtual ground line VGND, and the high-threshold n-channel enhancement type switching transistor 21s in the incomplete off-state offers a current path from the virtual ground line VGND to the ground line GND. The reason for the incomplete off-state is the difference in entry timing to the sleep mode between the logic circuits as described hereinbefore.

The switching circuit 23 has electrically isolated the bus line BUS2 from the bus driver 21, and disconnects the bus line BUS2 from the tri-state inverter 211 and the tri-state inverter 212 from the bus line BUS2. In detail, the switching elements 231–23n turned off at time t13, and the current paths between the tri-state inverters 211/212 and the bus line BUS2 have been already closed. For this reason, even though the tri-state inverters 211/212 are put in the condition to flow the current, any electric current does not flow from the positive power supply line VDD through the bus driver 21, the bus line BUS2, the virtual ground line VGND and the high-threshold n-channel enhancement type switching transistor 21s into the ground line GND. This results in reduction of power consumption in the sleep mode.

The sleep mode signal SLB2 is changed to the high level at time t17, and the high-threshold n-channel enhancement type switching transistor 21s turns on so as to electrically connect the virtual ground line VGND to the ground line GND. The virtual ground line VGND is recovered from the floating state to the potential level approximately equal to the ground level. After lapse of time tD1B, the signal line for the data signal DT1 is recovered to the low level at time t18, and the enable signal EN2 is recovered to the low level at time t19 after lapse of time tE2B. The data signal DT2 and the enable signal EN1 have been maintained in the high level through the sleep mode. Thus, the data signals DT1/DT2 and the enable signals EN1/EN2 are unchanged before entry into the sleep mode and after the exit from the sleep mode, and the sleep mode does not affect the logic function of the bus driver 21. The time period tE2B is longer than the time period tD1B, and the tri-state inverters 211/212 and the high-threshold n-channel enhancement type switching transistor 21s make ready to flow the current between the positive power supply line VDD and the ground level GND after time t19. However, the control signal KPB1 is still in the low level, and the switching elements 231–23n remain open. Thus, the through-current does not flow from the positive power supply line VDD through the bus line BUS2 to the ground line GND, and the power consumption is not increased.

Subsequently, the logic circuits 24 releases the data signals DT1/DT2 and the enable signals EN1/EN2 from the previous levels, and are allowed to change the data signals DT1/DT2 and the enable signals EN1/EN2. The logic circuit 26 changes the control signal KPB1 to the high level at time t20, and switching elements 231–23n concurrently turn on. As a result, the tri-state inverters 211–21n can drive the bus line BUS2 with the inverted data signals IDT1–IDTn. A hold time tKH between time t17 and time t20 is longer than the recovery time periods tD1B/tE2B.

As will be understood, the switching elements 211–21n isolates the bus line BUS2 from the bus driver 21 in the set-up time tKS and the hold time tKH, and the switching circuit 21 does not allow the through-current to flow from the positive power supply line VDD and the ground line GND. This results in improvement of the power consumption.

In the first embodiment, the bus driver 21 is corresponding to a first component circuit, and the enable signal EN1–ENn and the data signals DT1–DTn serve as input signals. The bus line BUS2 is corresponding to a signal line.

Second Embodiment

Figure 5:
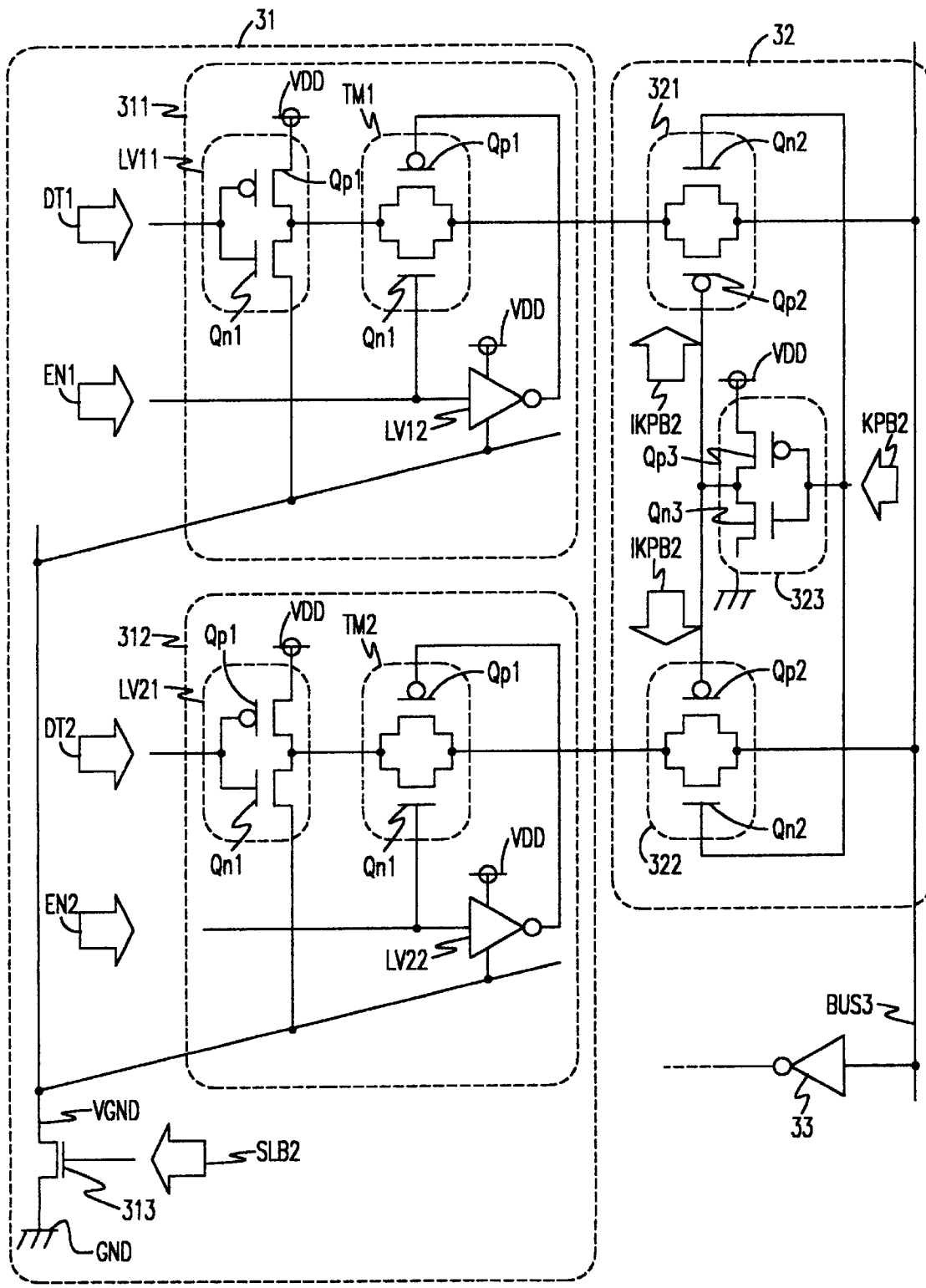
FIG. 5 is a circuit diagram showing the circuit configuration of an essential part of another semiconductor integrated circuit device according to the present invention.

Turning to FIG. 5, a bus driver 31, a switching circuit 32, a bus receiver 33 and a bus line BUS3 are incorporated in an integrated circuit device embodying the present invention. The integrated circuit device is fabricated on a semiconductor chip (not shown). Although other logic circuits are further integrated on the semiconductor chip, they are not shown in FIG. 5, and data signals DT1/DT2 and enable signals EN1/EN2 are supplied from some of the other logic gates to the bus driver 31.

Figure 1:
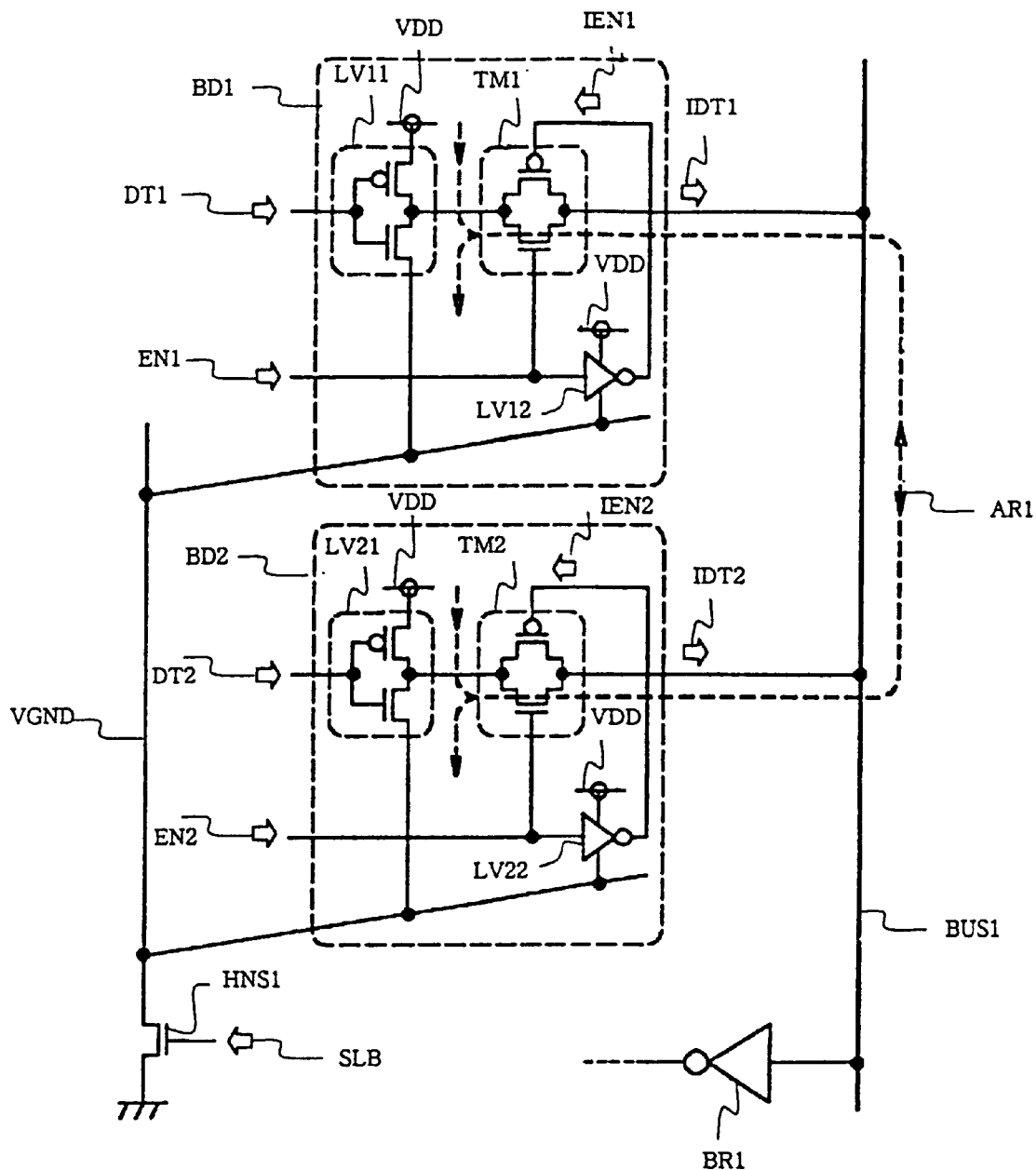
FIG. 1 is a circuit diagram showing the circuit configuration of the prior art data transfer system.
Figure 2:
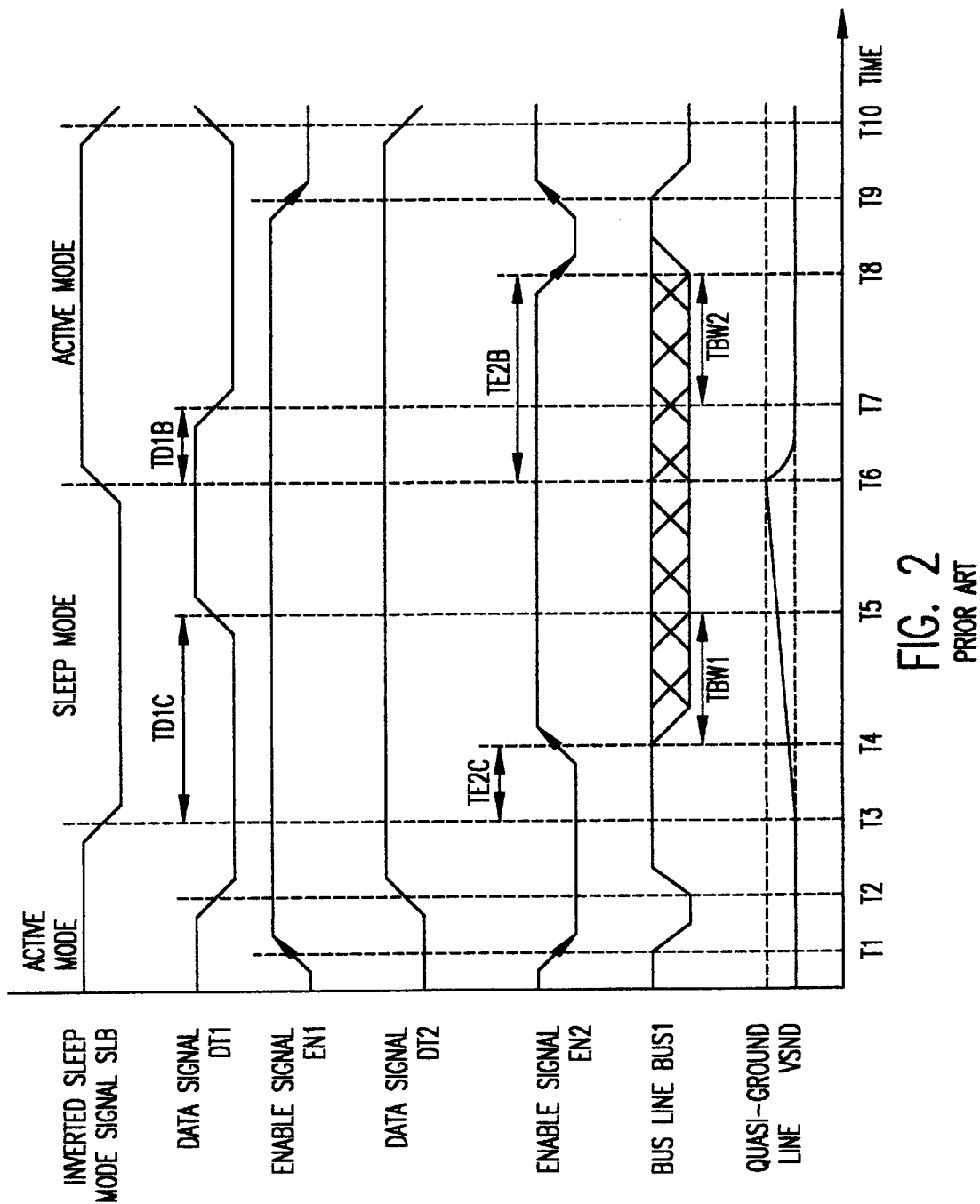
FIG. 2 is a timing chart showing the transitions between the active mode and the sleep mode in the prior art data transfer system.

The bus driver 31 comprises tri-state inverters 311/312 and a high-threshold n-channel enhancement type switching transistor 313. The tri-state inverters 311/312 are powered from a positive power supply line VDD and a virtual ground line VGND, and the high-threshold n-channel enhancement type switching transistor 313 is connected between the virtual ground line VGND and the ground line GND. The tri-state inverters 311/312 are similar in circuit configuration to the tri-state inverters BD1/BD2 shown in FIG. 1, and the circuit components of the tri-state inverters 311/312 are labeled with the references designating corresponding circuit components of the prior art tri-state inverters BD1/BD2 without detailed description. The n-channel enhancement type field effect transistors and the p-channel enhancement type field effect transistors of the tri-state inverters 311/312 are labeled with Qn1 and Qp1, respectively.

The sleep mode signal SLB2 changes the bus driver 31 between the active mode and the sleep mode. The sleep mode signal SLB2 of the low level is representative of the sleep mode, and causes the high-threshold n-channel enhancement type switching transistor 313 to turn off. The high-threshold n-channel enhancement type switching transistor 313 isolates the virtual ground line VGND from the ground line GND, and does not allow sub-threshold leakage current to pass therethrough. The tri-state inverters 311/312 are selectively enabled with the enable signals EN1/EN2 in the active mode, and one of the tri-state inverters 311/312 becomes responsive to the data signal DT1/DT2 so as to produce an inverted data signal IDT1/IDT2. The n-channel enhancement type field effect transistors Qn1 and the p-channel enhancement type field effect transistors Qp1 have low-thresholds, respectively, and are changed between the on-state and the off-state at high speed.

The switching circuit 32 includes plural transfer gates 321–322 and an inverter 323. The transfer gate 321/322 is implemented by the parallel combination of an n-channel enhancement type field effect transistor Qn2 and a p-channel enhancement type field effect transistor Qp2, and, accordingly, are bi-directional. The n-channel enhancement type field effect transistors Qn2 have a threshold equal to the low-threshold n-channel enhancement type field effect transistors Qn1 or the threshold of the high-threshold n-channel enhancement type switching transistor 313. The p-channel enhancement type field effect transistors Qp2 are equal in threshold to the p-channel enhancement type field effect transistors Qp1, or larger in threshold than the p-channel enhancement type field effect transistors Qp1.

On the other hand, the inverter 323 is implemented by a series combination of a p-channel enhancement type field effect transistor Qp3 and an n-channel enhancement type field effect transistor Qn3. The inverter 323 is powered with the positive power supply line VDD and the ground line GND, and a control signal KPB is supplied to the gate electrode of the n-channel enhancement type field effect transistor Qn3 and the p-channel enhancement type field effect transistor Qp3. The common drain node of the field effect transistors Qp3/Qn3 is connected to the gate electrodes of the p-channel enhancement type field effect transistors Qp2. The p-channel enhancement type field effect transistor Qp3 and the n-channel enhancement type field effect transistor Qn3 have the high-thresholds, respectively, and sub-threshold leakage current does not flow through the inverter 323.

The control signal KPB2 is directly supplied to the gate electrodes of the n-channel enhancement type field effect transistors Qn2, and the inverter 323 supplies the inverted signal IKPB2 of the control signal KPB2 to the gate electrodes of the p-channel enhancement type field effect transistors Qp2. Thus, the transfer gates 321/322 concurrently turn on in the presence of the control signal KPB2 of the active high level, and connects the tri-state inverters 311–312 to the bus line BUS3.

The set-up time tKS and the hold time tKH are given to the entry into the sleep mode and the exit from the sleep mode as similar to the first embodiment, and the switching circuit 32 does not allow electric current to flow from the positive power supply line VDD to the ground line GND. Thus, the switching circuit 32 achieves the advantages of the first embodiment.

In the second embodiment, the bus driver 31 and the bus line BUS3 are corresponding to a first component circuit and a signal line, respectively. The n-channel enhancement type field effect transistors Qn1 and the p-channel enhancement type field effect transistors Qp1 serve as first transistors, and the high-threshold n-channel enhancement type switching transistor 313 serves as a second transistor.

Third Embodiment

Figure 6:
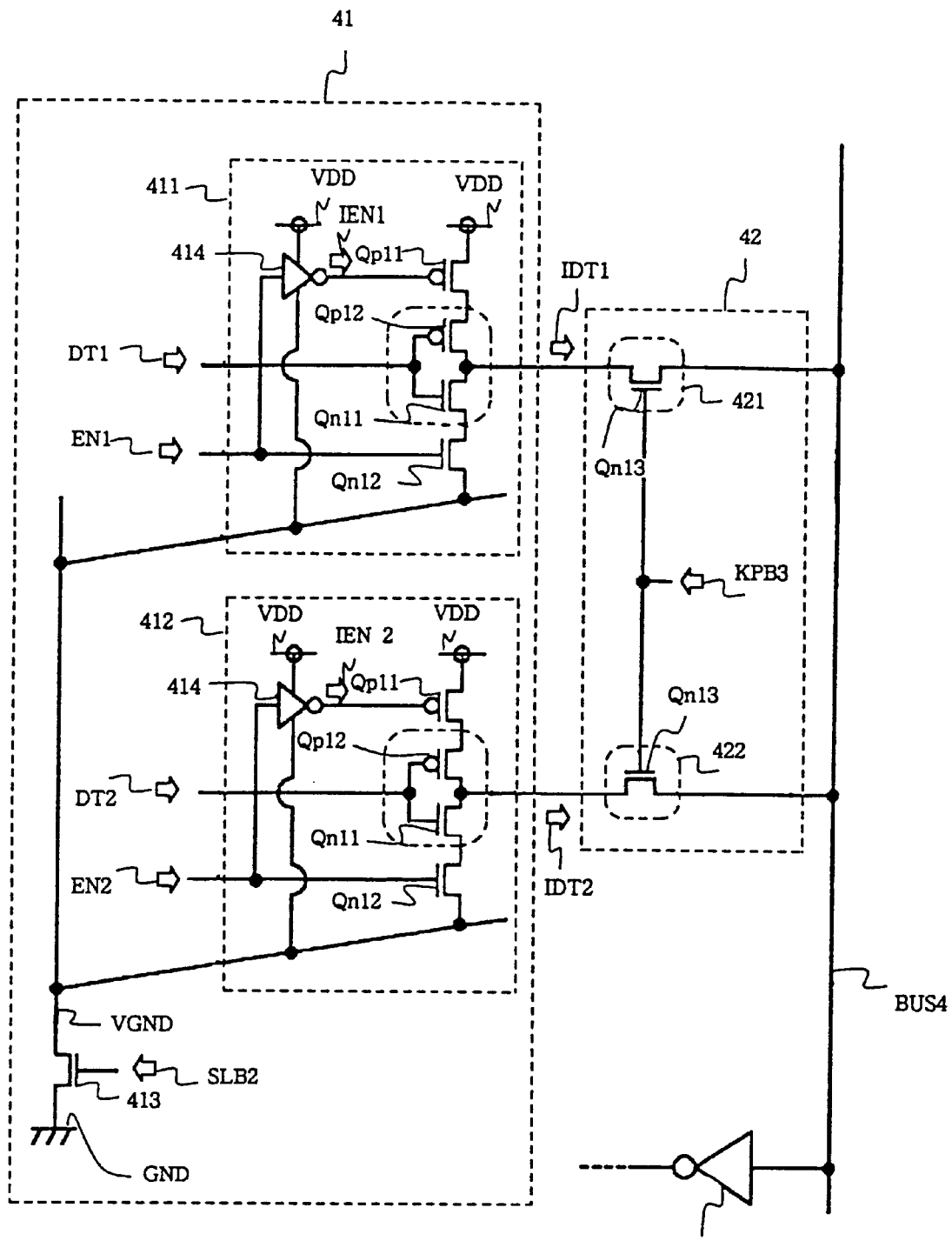
FIG. 6 is a circuit diagram showing the circuit configuration of an essential part of yet another semiconductor integrated circuit device according to the present invention.

FIG. 6 illustrates an essential part of yet another semiconductor integrated circuit device embodying the present invention. The semiconductor integrated circuit device comprises a bus driver 41, a switching circuit 42, a bus receiver 43 and a bus line BUS4. Logic circuits corresponding to the logic circuits 24 may be further incorporated in the semiconductor integrated circuit device.

The bus driver 41 includes tri-state inverters 411/412 and a high-threshold n-channel enhancement type switching transistor 413. On the other hand, the switching circuit 42 includes plural switching elements 421/422. Thus, the bus driver 41 and the switching circuit 42 are similar in circuit arrangement to those of the second embodiment. However, the tri-state inverters 411/412 and the switching elements 421/422 are different in circuit configuration from those of the second embodiment.

The tri-state inverter 411/412 includes a series combination of p-channel enhancement type field effect transistors Qp11/Qp12 and n-channel enhancement type field effect transistors Qn11/Qn12 and an inverter 414. The series combination of the field effect transistors Qp11/Qp12/Qn11/Qn12 is connected between a positive power supply line VDD and a virtual ground line VGND, and the inverter 414 is also powered with the positive power supply line VDD and the virtual ground line VGND. The enable signal NE1/EN2 is supplied to the inverter 414, and the inverter 414 produces an inverted signal IEN1/IEN2. The enable signal EN1/EN2 and the inverted signal IEN1/IEN2 are supplied to the gate electrode of the n-channel enhancement type field effect transistor Qn12 and the gate electrode of the p-channel enhancement type field effect transistor Qp11, respectively. The data signal DT1/DT2 is supplied to the gate electrode of the p-channel enhancement type field effect transistor Qp12 and the gate electrode of the n-channel enhancement type field effect transistor Qn11. The inverter 414 is similar to a part of the series combination encircled in broken line, i.e., the p-channel enhancement type field effect transistor Qp12 and the n-channel enhancement type field effect transistor Qn11 connected in series.

When the enable signal EN1/En2 is changed to the high level, the n-channel enhancement type field effect transistor Qn12 and the p-channel enhancement type field effect transistor Qp11 turn on, and the positive power supply line VDD and the virtual ground line VGND are electrically connected to the p-channel enhancement type field effect transistor Qp12 and the n-channel enhancement type field effect transistor Qn11. In this situation, the p-channel enhancement type field effect transistor Qp12 and the n-channel enhancement type field effect transistor Qn11 complementarily turn on and off depending upon the voltage level of the data signal DT1/DT2, and supplies an inverted data signal IDT1/IDT2 to the switching circuit 42. The n-channel enhancement type field effect transistors Qn11/Qn12 have the low threshold lower than that of the high-threshold n-channel enhancement type switching transistor 413, and the p-channel enhancement type field effect transistors Qp11/Qp12 have a threshold corresponding to the threshold of the n-channel enhancement type field effect transistors Qn11/Qn12. For this reason, the tri-state inverters 411/412 achieve a high-speed inversion. The highthreshold n-channel enhancement type switching transistor does not allow the current to flow by virtue of the high-threshold.

If the enable signal EN1/EN2 is in the low level, the n-channel enhancement type field effect transistor Qn12 and the p-channel enhancement type field effect transistor Qp11 are turned off, and the p-channel enhancement type field effect transistor Qp12 and the n-channel enhancement type field effect transistor Qn11 are disconnected from the positive power supply line VDD and the virtual ground line VGND. The p-channel enhancement type field effect transistor Qp12 and the n-channel enhancement type field effect transistor Qn11 are never responsive to the data signal DT1/DT2, and the tristate inverter 311/312 enters the high-impedance state.

The switching element 421/422 is implemented by an n-channel enhancement type field effect transistor Qn13. The n-channel enhancement type field effect transistors Qn13 are connected between the associated tri-state inverters 411/412, respectively, and a control signal KPB3 is supplied to the gate electrodes of the n-channel enhancement type field effect transistors Qn13. If the control signal KPB3 is in the high level, the n-channel enhancement type field effect transistors Qn13 are turned on, and the tri-state inverters 411 are connected through the associated n-channel enhancement type field effect transistors Qn13 to the bus line BUS4. On the other hand, if the control signal KPB3 is changed to the low level, the n-channel enhancement type field effect transistors Qn13 turn off, and the tri-state inverters 411/412 are disconnected from the bus line BUS4.

The n-channel enhancement type field effect transistors Qn13 have either high or low threshold, and a logic circuit (not shown) swings the control signal KPB3 across the threshold of the n-channel enhancement type field effect transistors Qn13. The sleep mode signal SLB2 and the control signal KPB3 are changed similarly to those shown in FIG. 4, and the switching circuit 42 effectively reduces the through-current. Thus, the semiconductor integrated circuit device implementing the third embodiment achieves the advantages of the first embodiment. Moreover, the switching circuit 42 is simpler than the switching circuit 32, and the manufacturer integrates the circuits 41/42 on an area narrower than that of the circuits 31/32.

Fourth Embodiment

Figure 7:
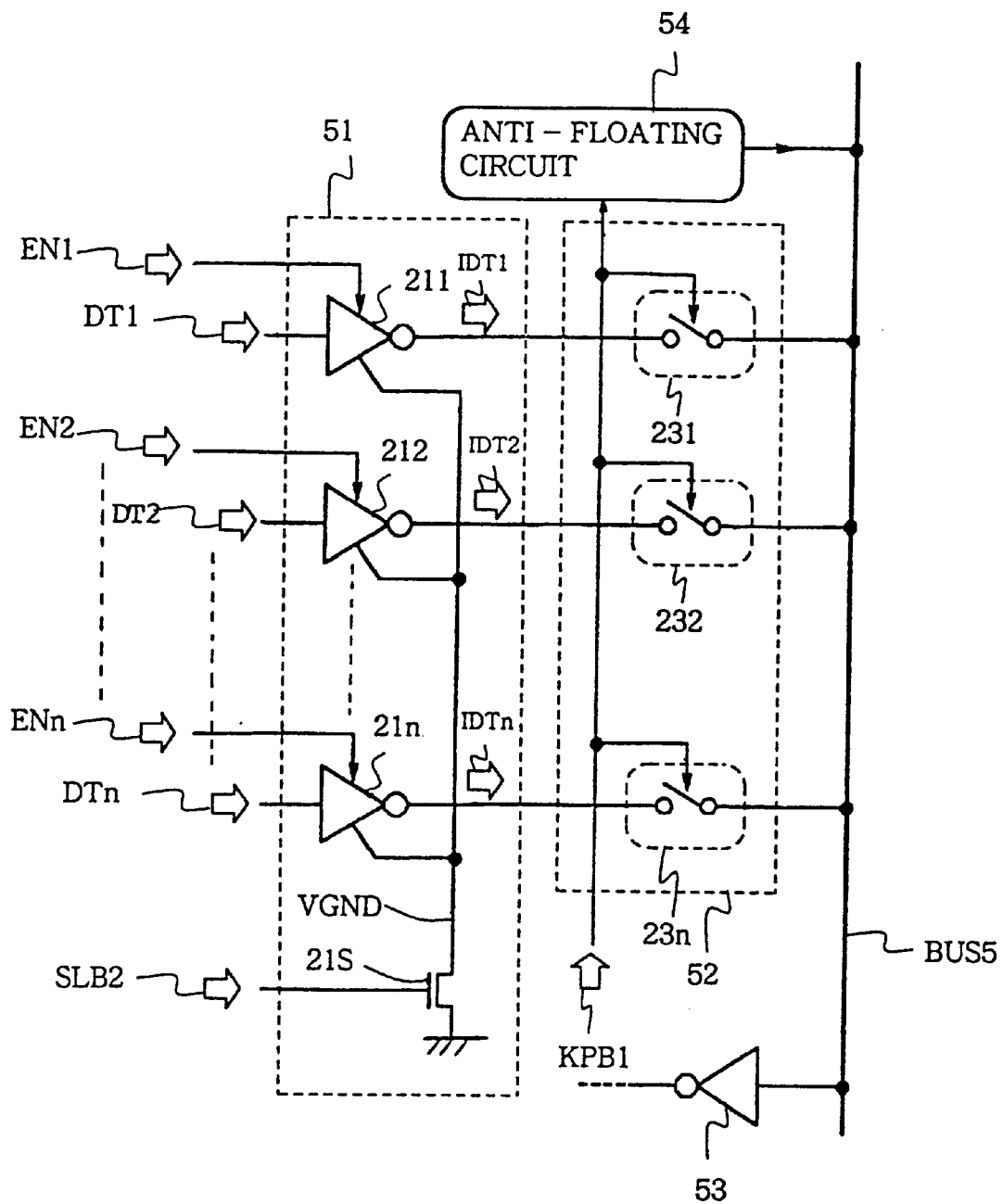
FIG. 7 is a circuit diagram showing the circuit configuration of an essential part of still another semiconductor integrated circuit device according to the present invention.

Turning to FIG. 7 of the drawings, an essential part of still another semiconductor integrated circuit device embodying the present invention comprises a bus driver 51, a switching circuit 52, a bus receiver 53, a bus line BUS5 and an anti-floating circuit 54. The bus driver 51 and the switching circuit 52 are similar to those of the first embodiment, and circuit components are labeled with the references designating corresponding circuit components of the first embodiment without detailed description. A signal source corresponding to the logic circuits 24 may be further incorporated in the semiconductor integrated circuit device.

The anti-floating circuit 54 is connected to the bus line BUS5, and the control signal KPB1 is supplied to the anti-floating circuit 54. The anti-floating circuit 54 prevents the bus line BUS5 from the floating state.

In detail, while the control signal KPB1 is in the high level, the switching elements 231–23n are closed, and the tri-state inverters 21–21n are connected through the switching elements 231–23n to the bus line BUS5. The bus line BUS5 is driven to either high or low level with the inverted data signal IDT1/IDT2/ . . . /IDTn. In this situation, the anti-floating circuit 54 is invalid to the bus line BUS5, and stays in the high-impedance state.

On the other hand, when the control signal KPB1 is changed to the low level, the switching elements 231–23n are opened, and disconnect the bus line BUS5 from the tri-state inverters 211–21n. The anti-floating circuit 54 becomes valid, and supplies a low level or a high level to the bus line BUS5. Thus, the anti-floating circuit 54 prevents the bus line BUS5 from the floating state.

The floating state is undesirable for the bus receiver 53. As described hereinbefore, the leakage current raises the potential level on the bus line BUS5 in the floating state. An intermediate potential level on the bus line BUS5 gives rise to through-current in the bus receiver 53, and the through-current increases the power consumption of the semiconductor integrated circuit device. However, the anti-floating circuit 54 fixes the bus line BUS5 to the low level or the high level, and does not allow the current to flow through the bus receiver 53.

The semiconductor integrated circuit device implementing the fourth embodiment achieves the advantages of the first embodiment, and further reduces the power consumption by virtue of the anti-floating circuit 54.

Fifth Embodiment

Figure 8:
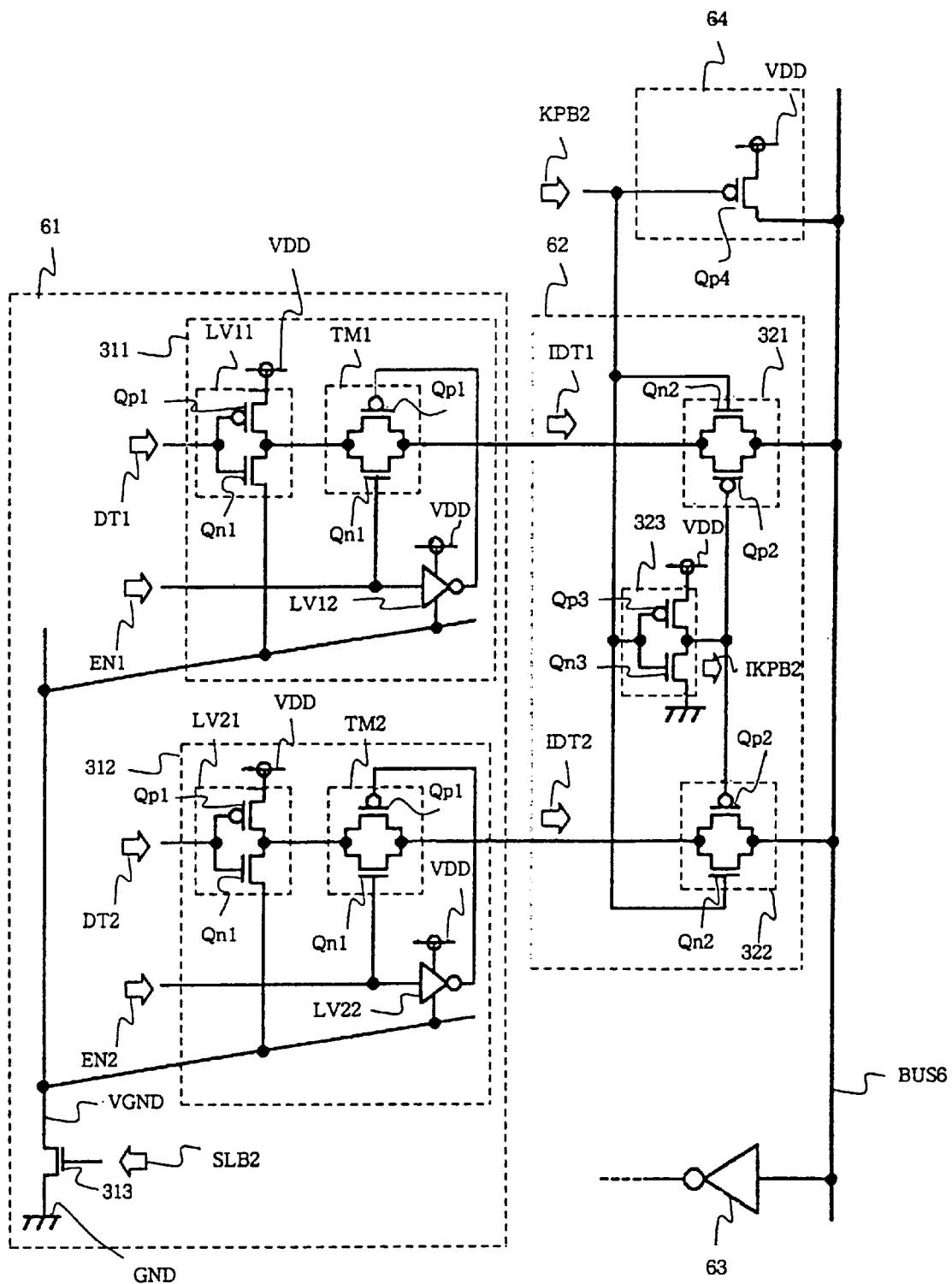
FIG. 8 is a circuit diagram showing the circuit configuration of an essential part of another semiconductor integrated circuit device according to the present invention.

Turning to FIG. 8 of the drawings, another semiconductor integrated circuit device embodying the present invention comprises a bus driver 61, a switching circuit 62, a bus receiver 63, a clamp circuit 64 and a bus line BUS6. The bus driver 61 and the switching circuit 62 are similar in circuit configuration to the bus driver 31 and the switching circuit 32 incorporated in the second embodiment, and component elements of these circuits are labeled with references designating corresponding circuit components of the bus driver 31 and the corresponding circuit components of the switching circuit 32 without detailed description. A signal source corresponding to the logic circuits 24 may be further incorporated in the semiconductor integrated circuit device.

The clamp circuit 64 serves as an anti-floating circuit, and is implemented by a p-channel enhancement type field effect transistor Qp4. The p-channel enhancement type field effect transistor Qp4 has a threshold larger than that of the p-channel enhancement type field effect transistors Qp1. For this reason, electric current hardly flows from the positive power supply line VDD through the p-channel enhancement type field effect transistor Qp4 in the off-state.

The p-channel enhancement type field effect transistor Qp4 is connected between the positive power supply line VDD and the bus line BUS6, and the control signal KPB2 is supplied to the gate electrode of the p-channel enhancement type field effect transistor Qp4. Thus, the p-channel enhancement type field effect transistor Qp4 is responsive to the control signal KPB2 so as to connect the positive power supply line VDD to and disconnect it from the bus line BUS6. The relation between the control signal KPB2 and the clamp circuit 64 is summarized in FIG. 9.

As described hereinbefore, the control signal KPB2 is supplied to the switching elements 321/322, and the tri-state inverters 311/312 are connected to and disconnected from the bus line BUS6 depending upon the potential level of the control signal KPB2. While the control signal KPB2 is in the high level, the switching circuit 62 connects the tri-state inverters 311/312 to the bus line BUS6, and the clamp circuit 64 isolates the bus line BUS6 from the positive power supply line VDD. Selected one of the tri-state inverters 311/312 drives the bus line BUS6 with the inverted data signal IDT1/IDT2. The threshold of the p-channel enhancement type field effect transistor Qp4 is so high that it does not permit electric current to flow therethrough in the off-state. As a result, the clamp circuit 64 never disturbs the data transfer through the bus line BUS6.

On the other hand, when the control signal KPB2 is changed to the low level, the switching circuit 62 isolates the bus line BUS6 from the bus driver 61, and the clamp circuit 64 connects the positive power supply line VDD to the bus line BUS6. As a result, the bus line BUS6 is clamped at the positive power voltage level.

Sixth Embodiment

Figure 10:
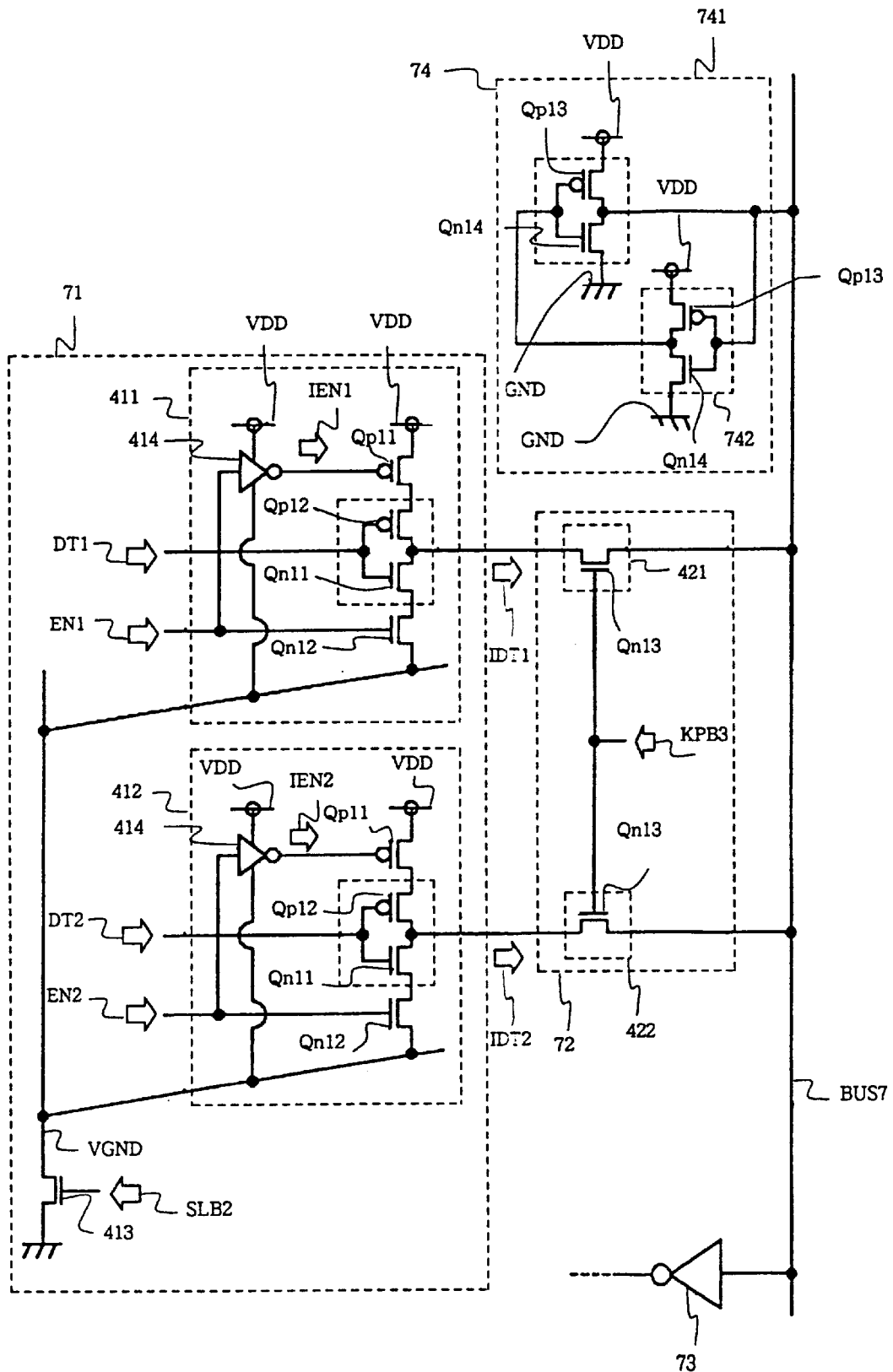
FIG. 10 is a circuit diagram showing the circuit configuration of an essential part of another semiconductor integrated circuit device according to the present invention.

Turning to FIG. 10 of the drawings, another semiconductor integrated circuit device embodying the present invention comprises a bus driver 71, a switching circuit 72, a bus receiver 73, an anti-floating circuit 74 and a bus line BUS7. The bus driver 71 and the switching circuit 72 are similar in circuit configuration to the bus driver 41 and the switching circuit 42 incorporated in the third embodiment, and component elements of these circuits are labeled with references designating corresponding circuit components of the bus driver 41 and the corresponding circuit components of the switching circuit 42 without detailed description. A signal source corresponding to the logic circuits 24 may be further incorporated in the semiconductor integrated circuit device.

The anti-floating circuit 74 includes two inverters 741/742. The input nodes of the inverters 741/742 are connected to the bus line BUS7 and the output node of the inverter 741, and the output node of the inverter 741 is connected to the bus line BUS7. Thus, the inverters 741/742 form a memory loop or a bi-stable circuit, and store the potential level on the bus line BUS7. The inverter 741/742 is implemented by a series combination of a p-channel enhancement type field effect transistor Qp13 and an n-channel enhancement type field effect transistor Qn14. The p-channel enhancement type field effect transistors Qp13 have a threshold larger than that of the p-channel enhancement type field effect transistors Qp11/Qp12, and the n-channel enhancement type field effect transistors Qn14 have a threshold larger than that of the n-channel enhancement type field effect transistors Qn11/Qn12. For this reason, the p-channel enhancement type field effect transistors Qp13 effectively block the bus line BUS7 from the positive power voltage in the off-state, and the n-channel enhancement type field effect transistors Qn14 also effectively block the bus line BUS7 from the ground level in the off-state.

While the bus driver 71 is driving the bus line BUS7 with the inverted data signal IDT12/IDT2, the anti-floating circuit 74 latches the potential level on the bus line BUS7. If the bus driver 71 changes the potential level on the bus line BUS7 from the low level to the high level, the high level on the bus line BUS7 makes the inverter 742 supply the low level to the input node of the inverter 741, and the inverter 741 changes the output node thereof to the high level. Thus, the anti-floating circuit 74 stores a potential level on the bus line BUS7, and keeps the sub line BUS7 in the potential level until a change of the potential level on the bus line BUS7.

As will be appreciated from the foregoing description, the switching circuit isolates the bus line from the data driver in the transition periods as well as in the sleep mode. Even if leakage current changes the enable signal and the data signal, the switching circuit keep the bus line isolated from the bus driver, and does not flow the electric current through the bus line. This results in reduction of power consumption.

In the embodiments with the anti-floating circuit, the anti-floating circuit prevents the bus line from the floating state, and enhances the reliability of the bus line.

Although particular embodiments of the present invention have been shown and described, it will be apparent to those skilled in the art that various changes and modifications may be made without departing from the spirit and scope of the present invention. For example, the inverter LV11/LB21 may be replaced with another kind of logic gate such as, for example, a NAND gate or a NOR gate.

Even if the logic gates does not recover the data signal and the enable signal to the previous levels after exit from the sleep mode, the switching circuit is effective against the leakage current through the bus line, because the bus driver makes ready to flowing the current between time t4 and time t5.

What is claimed is:

1. A semiconductor integrated circuit device comprising:
    a first component circuit selectively entering an active mode and a sleep mode, and including
        an input port having plural input nodes supplied with input signals,
        an output port having output nodes assigned to output signals and
        first transistors connected between a first power supply line and a virtual power supply line different in potential level from said first power supply line, much liable to flow a first leakage current therethrough and responsive to said input signal in said active mode for producing said output signal at said output port;
    a second transistor connected between said virtual power supply line and a second power supply line different in potential level from said first power supply line, less liable to flow a second leakage current therethrough, and responsive to a mode signal so as to connect said virtual power supply line to said in said sleep mode in said active mode and disconnect said virtual power supply line from said second power supply line;
    a signal line connectable to said plural output nodes; and
    a switching circuit connected between said output nodes and said signal line, and responsive to a control signal so as to connect said output nodes to said signal line in said active mode and disconnect said output nodes from said signal line in at least said sleep mode.

2. The semiconductor integrated circuit device as set forth in claim 1, in which said first leakage current selectively changes said input signals so that said first component circuit offers a first current path from said first power supply line to at least one of said output nodes and a second current path from another of said output nodes through said virtual power supply line to said second transistor at a first time, and said switching circuit disconnects said output nodes from a bus line at a second time earlier than said first time.

3. The semiconductor integrated circuit device as set forth in claim 2, in which said second time is in said active mode before said sleep mode.

4. The semiconductor integrated circuit device as set forth in claim 2, in which said first transistors form plural bus driving units independently driving said signal line serving as said bus line in response to said input signals selectively supplied to said plural bus driving units, and said second time is in said active mode before said sleep mode.

5. The semiconductor integrated circuit device as set forth in claim 4, in which said first transistors are field effect transistors having first thresholds, and said second transistor is a field effect transistor having a second threshold wider than said first thresholds.

6. The semiconductor integrated circuit device as set forth in claim 5, in which said first transistors form tri-state inverters serving as said bus driving units, respectively.

7. The semiconductor integrated circuit device as set forth in claim 4, further comprising an anti-floating circuit connected to said signal line so as to connect said signal line to at least one constant power source while said switching circuit is disconnecting said output nodes from said signal line.

8. The semiconductor integrated circuit device as set forth in claim 1, further comprising a second component circuit serving as a signal source of said input signals.

9. The semiconductor integrated circuit device as set forth in claim 8, in which said second component circuit determines current potential levels of said input signals before entry into said sleep mode, and releases said input signals from said current potential levels at a first time after exit from said sleep mode to the next active mode.

10. The semiconductor integrated circuit device as set forth in claim 9, in which said first leakage current selectively changes said input signals at a second time after the determination of said current potential levels so that said first component circuit offers a first current path from said first power supply line to at least one of said output nodes and a second current path from another of said output nodes through said virtual power supply line to said second transistor.

11. The semiconductor integrated circuit device as set forth in claim 10, in which said switching circuit disconnects said output nodes from said signal line at a third time earlier than said second time, and connects said output nodes to a bus line at a fourth time later than said first time.

12. The semiconductor integrated circuit device as set forth in claim 11, in which said output nodes are respectively incorporated in bus driving units formed by said first transistors and independently driving said signal line in response to said input signals selectively supplied thereto through said input nodes.

13. The semiconductor integrated circuit device as set forth in claim 12, in which said bus driver units behave as tri-state inverters, respectively.

14. The semiconductor integrated circuit device as set forth in claim 13, in which said input signals are broken down into enable signals respectively supplied to said tri-state inverters and data signals respectively supplied to said tri-state inverters, and said enable signals make said tri-state inverters selectively responsive to said data signals in said active mode before said determination of said current potential levels and said next active mode.

15. The semiconductor integrated circuit device as set forth in claim 14, in which each of said tri-state inverters includes
    a first inverter powered from said first power supply line and said virtual power supply line and responsive to associated one of said data signals for producing one of said output signals, and a switching element connected between said first inverter and associated one of said output nodes and responsive to one of said enable signal for transferring said associated one of said data signals from said first inverter to said associated one of said output nodes.

16. The semiconductor integrated circuit device as set forth in claim 15, in which said first inverter is formed by a series combination of one of said first transistors of one channel conductivity type and another of said first transistors of the opposite channel conductivity type, and said tri-state inverter further includes a second inverter producing an inverted enable signal from said one of said enable signals for supplying said inverted enable signal and said one of said enable signals to said switching element.

17. The semiconductor integrated circuit device as set forth in clam 15, in which said switching element is formed by a parallel combination of one of said first transistors of one channel conductivity type and another of said first transistors of the opposite channel conductivity type.

18. The semiconductor integrated circuit device as set forth in claim 15, in which said first inverter is formed by a series combination of one of said first transistors of one channel conductivity type and another of said first transistors of the opposite channel conductivity type, said tri-state inverter further includes a second inverter producing an inverted enable signal from said one of said enable signals for supplying said inverted enable signal and said one of said enable signals to said switching element, and said switching element is formed by a parallel combination of yet another of said first transistors of said one channel conductivity type and still another of said first transistors of said opposite channel conductivity type.

19. The semiconductor integrated circuit device as set forth in claim 18, in which said switching circuit includes bi-directional transfer gates connected between the switching elements of said tri-state inverters and said signal line and a third inverter producing an inverted control signal from said control signal for supplying said control signal and said inverted control signal to said bi-directional transfer gates.

20. The semiconductor integrated circuit device as set forth in claim 19, further comprising an anti-floating circuit connected to said signal line and connecting a source of constant potential level to said signal line while said bi-directional transfer gates disconnect said signal line from said switching elements.

21. The semiconductor integrated circuit device as set forth in claim 14, in which each of said tri-state inverters includes a series combination of one of said first transistors of one channel conductivity type, another of said first transistors of said one channel conductivity type, yet another of said first transistors of the opposite channel conductivity type and still another of said first transistors of said opposite channel conductivity type connected between said first power supply line and said virtual power supply line and supplied with one of said data signals at a gate electrode of said another of said first transistors and a gate electrode of said yet another of said first transistors, and an inverter powered from said first power supply line and said virtual power supply line and producing an inverted enable signal from one of said enable signal for selectively supplying said inverted enable signal and said enable signal to a gate electrode of said one of said first transistors and a gate electrode of said still another of said first transistors.

22. The semiconductor integrated circuit device as set forth in claim 21, in which said switching circuit includes third field effect transistors connected between the switching elements of said tri-state inverters and said signal line, and said control signal is supplied to gate electrodes of said third field effect transistors.

23. The semiconductor integrated circuit device as set forth in claim 22, further comprising an anti-floating circuit connected to said signal line and connecting said signal line to one of said first and second power supply lines while said third field effect transistors disconnect said signal line from said tri-state inverters.

24. The semiconductor integrated circuit device as set forth in claim 12, further comprising an anti-floating circuit connected to said signal line and preventing said signal line from floating state while said switching circuit disconnects said bus driving units from said signal line.

25. The semiconductor integrated circuit device as set forth in claim 24, in which said anti-floating circuit includes a third transistor connected between a source of constant voltage level and said signal line and responsive to said control signal so as to be changed between on-state and off-state.

26. The semiconductor integrated circuit device as set forth in claim 24, in which said anti-floating circuit includes a bi-stable circuit having an input node and an output node both connected to said signal line and changing said output node to a potential level at said input node.

27. The semiconductor integrated circuit device as set forth in claim 26, in which said bi-stable circuit includes a first inverter having an input node connected to said signal line, and a second inverter having an input node connected to an output node of said first inverter and an output node connected to said signal line.

28. The semiconductor integrated circuit device as set forth in claim 27, in which each of said first and second inverters is formed by a series combination of a third transistor of one channel conductivity type and a fourth transistor of the opposite channel conductivity type, and said third and fourth transistors are less liable to flow a third leakage current from said first and second power supply lines to a common drain node serving as said output node of said each of said first and second inverters.

* * * * *